United States Patent
Chen et al.

(10) Patent No.: US 11,836,017 B2
(45) Date of Patent: Dec. 5, 2023

(54) LEVER MECHANISM FOR QUICK RELEASE OF EXPANSION COMPONENT

(71) Applicant: Quanta Computer Inc., Taoyuan (TW)

(72) Inventors: Chao-Jung Chen, Taoyuan (TW); Kun-Pei Liu, Taoyuan (TW); Ming-Lun Ku, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/833,615

(22) Filed: Jun. 6, 2022

(65) Prior Publication Data
US 2023/0305606 A1    Sep. 28, 2023

Related U.S. Application Data

(60) Provisional application No. 63/269,959, filed on Mar. 25, 2022.

(51) Int. Cl.
*G06F 1/18* (2006.01)
*H05K 7/14* (2006.01)

(52) U.S. Cl.
CPC ........... *G06F 1/185* (2013.01); *H05K 7/1409* (2013.01); *H05K 7/1418* (2013.01)

(58) Field of Classification Search
CPC .. H05K 7/1409; H05K 7/1417; H05K 7/1418; G06F 1/185; G06F 1/186
See application file for complete search history.

(56) References Cited

U.S. PATENT DOCUMENTS 7,215,556 B2 * 5/2007 Wrycraft .............. H05K 7/1409
                                                361/756
10,939,574 B2 * 3/2021 Wu ...................... H05K 7/1489

* cited by examiner

*Primary Examiner* — James Wu
(74) *Attorney, Agent, or Firm* — NIXON PEABODY LLP

(57) ABSTRACT

An expansion bay for a computer device for easy insertion and extension of an expansion component is disclosed. The expansion bay has two facing side walls, a bottom panel joining the facing side walls, and a closed end. A front cross member joins the side walls to define a front open end. A pair of springs are located the closed end that force the expansion component away from the closed end. A pair of rotating levers are mounted on the front cross member near each of the side walls. Each of the rotating levers has a pin that engages a groove on the expansion component that is inserted through the open front end. The levers are rotated via the pins engaging the grooves when the expansion component is moved into and out of open front end.

17 Claims, 8 Drawing Sheets

LEVER MECHANISM FOR QUICK RELEASE OF EXPANSION COMPONENT

CROSS-REFERENCE TO RELATED APPLICATIONS

This patent application claims the benefit of U.S. Provisional Patent Application No. 63/269,959, filed Mar. 25, 2022. The contents of that application in its entirety are hereby incorporated by reference.

TECHNICAL FIELD

The present disclosure relates generally to housing mechanisms for expansion components for computing devices. More particularly, aspects of this disclosure relate to an expansion component bay with a rotating lever mechanism that allows for simple and quick release of an expansion device for a computing device chassis.

BACKGROUND

Computer systems (e.g., desktop computers, blade servers, rack-mount servers, etc.) are employed in large numbers in various applications. High demand applications, such as network based systems, data centers, or high density finite element simulations can push hardware of computing systems, require servers with specialized capabilities. Modern servers are typically designed to allow flexibility in terms of capabilities and components. One method is to design expansion bays that allows components such as cards, storage devices, processor boards and the like to be easily installed to enhance the basic capability of the server. An expansion bay will typically include trays that may support modular components. In order for easy service and changing components, many trays may be accessed without having to move the actual server chassis to access the components. For example, certain trays may slide out from the chassis, allowing the installation or removal of a component. Once installation is complete, the tray may be pushed back into the chassis.

Currently component trays require a series of mechanical mechanisms to insure that the trays are locked into place. For example, certain trays have rotatable levers that allow an operator to move the lever to an open position to allow the tray to be slid out from the chassis and accessed. When the tray is loaded, it is pushed into the chassis, and the lever is rotated to the closed position. The existing lever design is a mechanical design that allows rapid service of the tray via an ejector lever at a front panel of the tray. However, existing lever and tray mechanisms are relatively complex to allow the easy access through movement of the tray.

Thus, there is a need for a mechanism that allows an expansion component to be easily released from a computer chassis. There is a further need for a mechanism for holding an expansion component that is mechanically simple. There is a further need for a mechanism for holding an expansion component that does not require a tray for holding the expansion component in the chassis.

SUMMARY

One disclosed example is an expansion bay for a computer device including two facing side walls, a bottom panel joining the facing side walls, and a closed end joining the side walls and the bottom panel. A front open end is defined by the side walls and the bottom panel. The bay includes a first rotating lever having a first registration feature for engaging an expansion component insertable through the front open end. The bay includes a first spring on the closed end that forces the expansion component away from the closed end.

A further implementation of the example expansion bay is an embodiment including rollers on the interior of one of the side walls for guiding the expansion component in and out of the expansion bay. Another implementation is where the first registration feature is a pin that fits within a groove of the expansion component. Movement of the expansion component rotates the first rotating lever via movement of the pin in the groove. Another implementation is where the first lever includes a knob attached to a pin that engages a cross member in proximity to the open front end. Another implementation is where the bottom panel includes a second registration feature mating with the expansion component. Another implementation is where the expansion component is a peripheral component interconnect express (PCIe) compliant device. Another implementation is where the expansion component includes a circuit board having an edge connector engaging with a socket extending from the closed end. Another implementation is where the example expansion bay includes a second rotating lever having a second registration feature for engaging the expansion component. A second spring on the closed end forces the expansion component away from the closed end. The first rotating lever and the first spring are positioned proximate one of the side walls. The second rotating lever and the second spring are positioned proximate the other side wall.

Another disclosed example is computer device including a chassis having two side walls, and a front end. A motherboard is positioned in the chassis between the two side walls. A bay housing for holding an expansion component is mounted on the front end of the chassis. The bay housing includes two facing side walls, a bottom panel joining the facing side walls, and a closed end joining the side walls and the bottom panel. A front open end is defined by the side walls and the bottom panel. A first rotating lever has a first registration feature for engaging an expansion component insertable through the open front end. A first spring on the closed end forces the expansion component away from the closed end.

A further implementation of the example computer devices is an embodiment where the computer device is one of a storage server or an application server. Another implementation is where the bay housing further includes rollers on the interior of one of the side walls for guiding the expansion component in and out of the expansion bay. Another implementation is where the first registration feature is a pin that fits within a groove of the expansion component. Movement of the expansion component rotates the first rotating lever via movement of the pin in the groove. Another implementation is where the first lever includes a knob attached to a pin that engages a cross member in proximity to the front open end. Another implementation is where the bottom panel includes a second registration feature mating with the expansion component. Another implementation is where the expansion component is a peripheral component interconnect express (PCIe) compliant device. Another implementation is where the expansion component includes a circuit board having an edge connector engaging with a socket extending from the closed end of the bay. The socket is attached to the motherboard. Another implementation is where the bay housing further includes a second rotating lever having a second registration feature for engaging the expansion component. The bay housing includes a second spring on the closed end that forces the expansion component away from the closed end. The first rotating lever and the first spring are positioned proximate one of the side walls. The second rotating lever and the second spring are positioned proximate the other side wall.

Another disclosed example is an expansion bay for a computer device. The expansion bay has two facing side walls, a bottom panel joining the facing side walls, and a closed end. A front cross member joins the side walls to define a front open end. A pair of springs are located near the closed end and force the expansion component away from the closed end. A pair of rotating levers are mounted on the front cross member near each of the side walls. Each of the rotating levers has a pin that engages grooves on the expansion component that is inserted through the open front end. The levers are rotated via the pins engaging the grooves when the expansion component is moved into and out of open front end.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

Figure 1A:
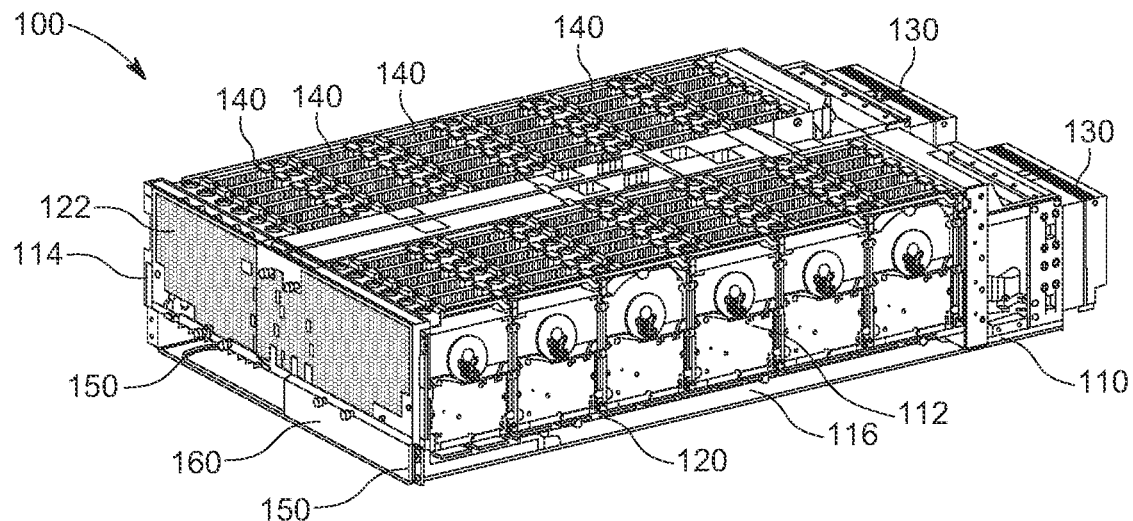
FIG. 1A is a perspective view of a computer system with example bays for holding expansion devices.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to an expansion component bay having a lever mechanism that allows an expansion component to be easily released from the bay without the use of a tray. The wall of the bay has springs that force the expansion component out of the bay. The expansion component may be pushed into the bay to compress the springs. Two rotating levers may be used to easily lock the expansion component into the bay. Once the levers are rotated and released, the springs may propel the expansion component out of the bay.

FIG. 1A is a perspective view of a computer system or computer device such as a storage server 100. The storage server 100 includes a chassis 110 with two side walls 112 and 114. The side walls 112 and 114 are joined by a bottom panel 116. A motherboard 120 is mounted between the side walls 112 and 114. The motherboard 120 is fixed between a front panel 122 and a rear panel 124 of the chassis 110. The motherboard 120 includes one or more components such as power supplies, processors such as CPUs, network interface cards, memory devices, and the like. A set of fan modules 130 are located near the rear of the chassis 110. The fan modules 130 generates air flow between the side walls 112 and 114 to assist in cooling the components of the storage server 100. The fan modules 130 are configured to set a direction for the incoming air flow and the outgoing air flow, such that both the incoming air flow and the outgoing air current flow move in a same direction.

In this example, the chassis 110 holds banks of hard disk drives (HDDs) 140 that are arranged in rows. In this example, there are two parallel banks of individual hard disk drives that are connected to the motherboard 120. Each bank has six rows of six individual hard disk drives 140 for a total of 72 HDDs. In this example, the hard disk drives 140 may be replaced by solid state drives (SSDs). A storage control board is contained in a housing between the two banks of individual hard disk drives 140.

The front panel 122 includes two bays 150 that allow the insertion of expansion component form factors. In this example, two bays 150 are provided, but any number of bay assemblies may be supported by different structures of the front panel 122. Each of the bays 150 allows for access to an expansion component such as an Input Output (IO) module that includes an IO board with a peripheral component interconnect express (PCIe) form factor to dock to a socket connector. For example, there may be power button/reset button/debug USB components located at front side of IO board in this form factor. Other types of computer devices such as an application server may have fewer storage devices and more bay assemblies for more expansion cards. The example bay assemblies using the rotatable fastener mechanism may be used for any suitable computer device such as storage devices (e.g., JBODs), switches, or the like.

Figure 1B:
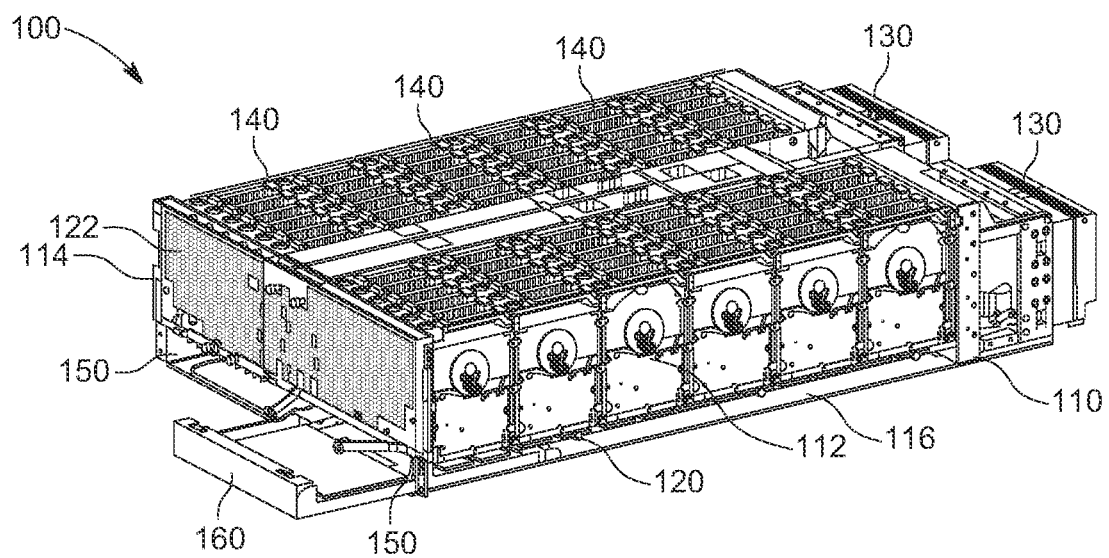
FIG. 1B is a perspective of the computer system in FIG. 1A with an expansion component partially removed from the bay in the chassis.

FIGS. 1A-1B shows the storage server 100, where one of the bays 150 near the side wall 114 is empty, allowing the insertion of an expansion component that conforms to a specific card form factor design, such as a peripheral component interconnect express (PCIe) compliant form factor. Another bay 150 near the side wall 112 has an expansion component 160 inserted as shown in FIG. 1A. As will be explained, the bay 150 includes two rotatable levers and spring mechanisms that allow an expansion component 160 to be inserted and retained by the levers. When the levers are released, the spring force from the spring mechanisms causes the expansion component 160 to be extended away from the storage server 100 for replacement as shown in FIG. 1B.

Figure 2:
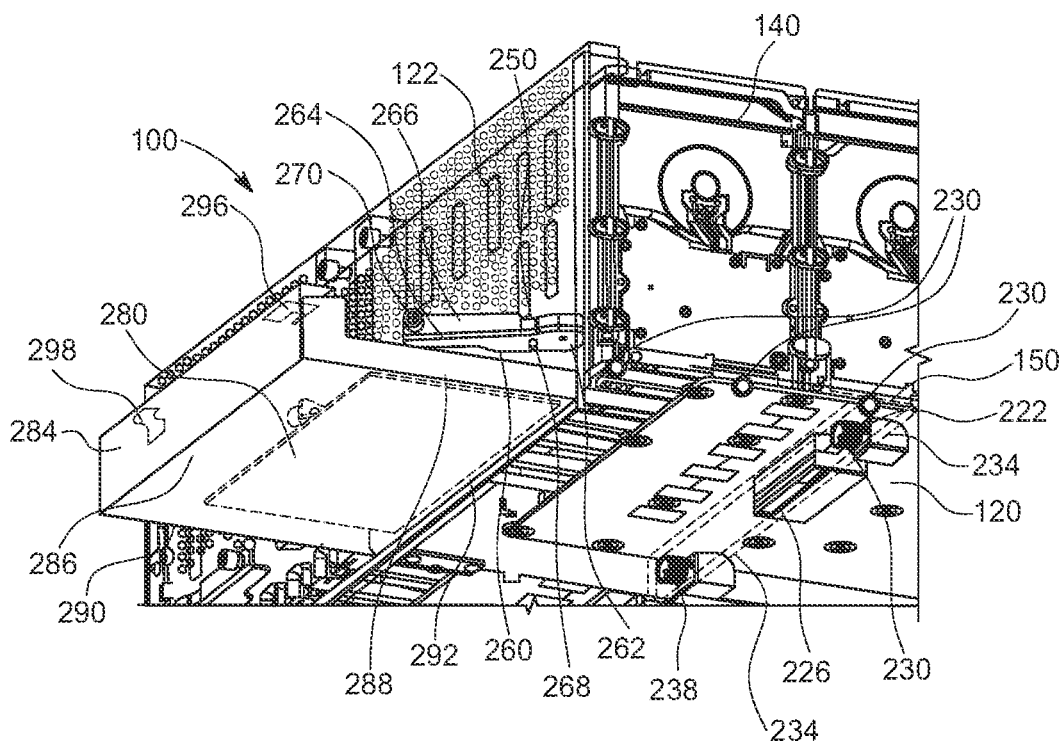
FIG. 2 is a close-up bottom perspective view of the example lever mechanism and component bay in the computer system in FIG. 1A.
Figure 3:
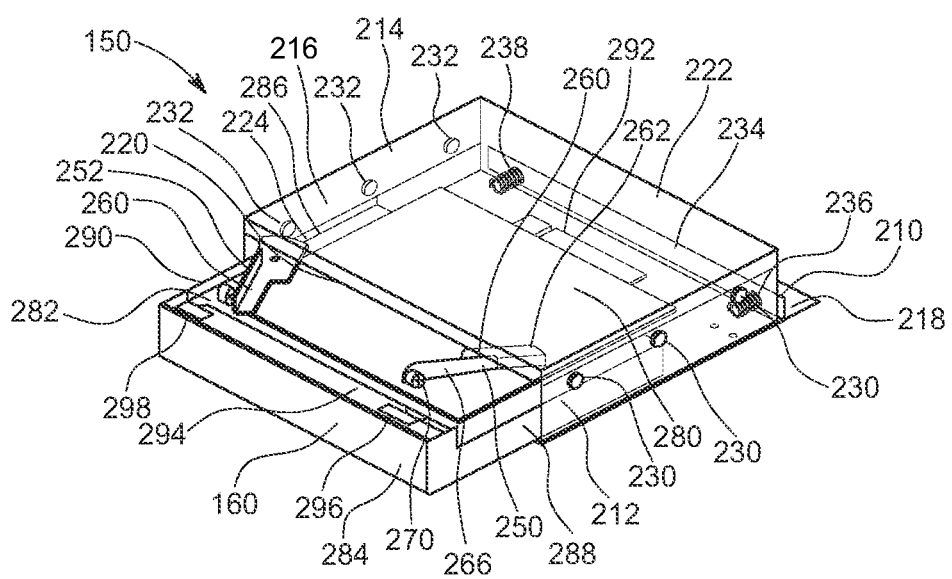
FIG. 3 is an isolated perspective view of the example lever mechanism and expansion component partially inserted in a bay of the computer system of FIG. 1A.
Figure 4:
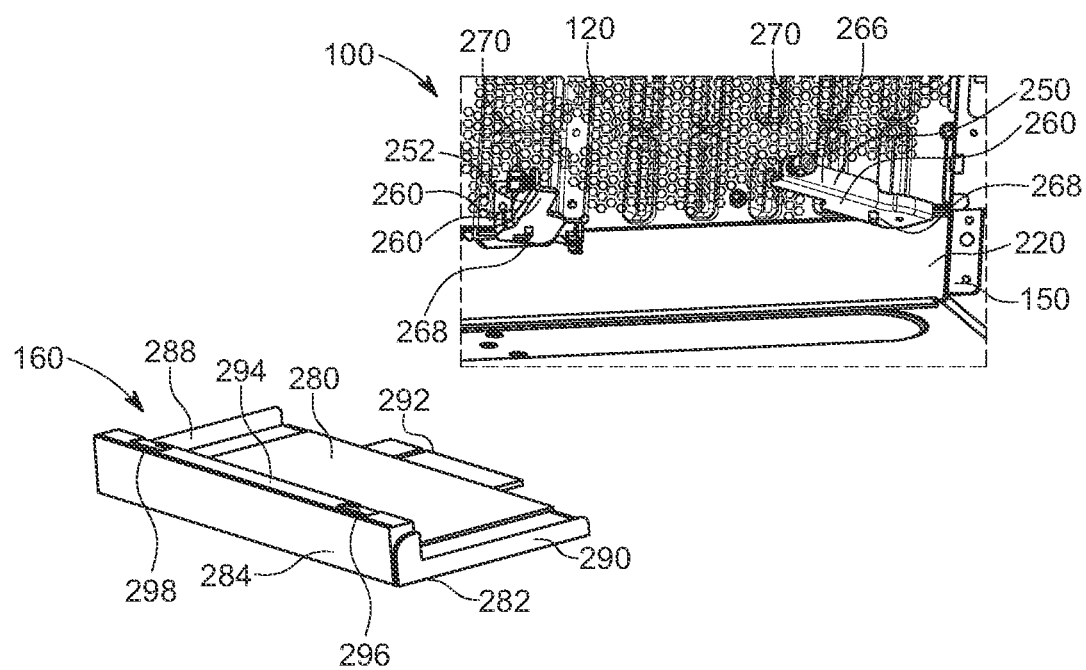
FIG. 4 is an exploded perspective view of the example expansion component and lever mechanism in FIG. 2.

FIG. 2 is a close-up bottom perspective view of one of the bays 150 in FIGS. 1A-1B of the storage server 100 with the bottom panel of the bay 150 removed for illustration purposes. FIG. 3 is an isolated perspective view of one of the bays 150 in FIGS. 1A-1B. FIG. 4 is an exploded perspective view of the example bay 150 and the expansion component 160 of the storage server 100. The bay 150 is designed to hold an expansion component with a certain form factor, such as that of the expansion component 160. Other form factors may be accommodated by changing the width, length and depth of the bay 150 but still incorporating the disclosed quick release mechanism. In this example, the expansion component 160 is a PCIe type device. The bay 150 has a housing 210 with two opposite side walls 212 and 214. The side walls 212 and 214 are joined to a top panel 216 and a bottom panel 218. The housing 210 has an open end 220 defined by the side walls 212 and 214 and the top and bottom panels 216 and 218. The bottom panel 218 has been removed from FIG. 2 to show other details of the bay 150. A front cross member 224 joins the side walls 212 and 214 and defines the open end of the housing 210. An opposite closed end 222 has a connector socket 226 that extends through the closed end. The connector socket 226 (not shown in FIG. 3 for clarity) interfaces with the expansion component 160. The connector socket 226 is mounted on the motherboard 120 to provide electrical connection to the expansion component 160.

The expansion component 160 may be moved into an inserted position that allows the component 160 to be entirely enclosed by the bay housing 210. The components in the chassis 110 may then electrically communicate with the expansion component 160. The expansion component may be released into an extended position as shown in FIG. 2 that allows the component 160 to be removed from the bay 200 as shown in FIG. 5.

The side walls 212 and 214 each have a series of rollers 230 and 232 respectively extending from the respective interior surfaces of the side walls 212 and 214. The rollers 230 and 232 are aligned to guide the expansion component 160 moving between the inserted position and the extended position. In this example, each of the side walls such as the side wall 212 has three rollers 230 spaced between the open end 220 and the closed end 222 such that one roller 230 is proximate the open end 220, one roller 230 is near the center of the side wall 212, and one roller 230 is near the rear closed end 222. The rollers 232 of the side wall 214 are arranged in similar positions on the interior surface of the side wall 214.

The rear closed end 222 has a support bar 234 with two attached springs 236 and 238 that are compressed when the expansion component 160 is in the inserted position. In this example, one of the springs 236 is positioned in proximity to the side wall 212 and the other spring 238 is positioned in proximity to the side wall 214. The spring force imparted by the springs 236 and 238 forces the expansion component 160 out of the bay housing 210 in the extended position shown in FIG. 2. More than two springs may be used to provide spring force to the expansion component 160.

Figure 5:
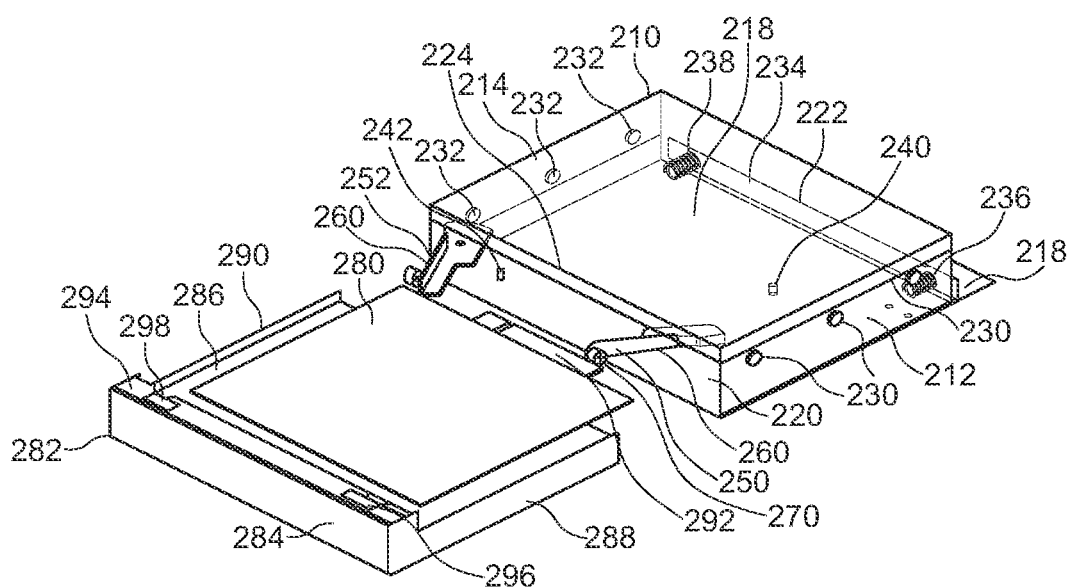
FIG. 5 is an exploded isolated perspective view of the example expansion component and lever mechanism in FIG. 2.

The bottom panel 218 is generally flat and has registration features such as pins 240 and 242 for engaging and aligning the expansion component 160 as shown in FIG. 5. The bottom of the expansion component 160 may have slots that engage the pins 240 and 242 to keep the expansion component 160 in a fixed position relative to the sides 212 and 214 of the bay housing 210. Although two pins are used in this example, any number of pins or other mechanisms may be used to align and engage the expansion component 160 in position on the bottom panel 218. In addition, the bottom panel 218 may have slots as registration features and the expansion component 160 may have pins that fit within the slots.

In this example, the front cross member 224 supports two rotatable lever assemblies 250 and 252. The lever assemblies 250 and 252 each include a lever plate 260 that may rotated toward or away from the front cross member 224. A larger end 262 of the lever plate 260 is rotatably mounted near the side walls 212 or 214. The lever plate 260 includes a narrower opposite end 264. A side plate 266 is attached perpendicularly to the narrow end 264 and partially attached to the larger end 262 of the lever plate 260. The lever plate 260 has a bottom surface. A guide pin 268 extends from the bottom surface of the lever plate 260 from the larger end 262. The larger end 262 of the lever plate 260 includes a pivot mechanism allowing the lever plate 260 to be rotated relative to the front cross member 224. One side of the side plate 266 near the narrow end 264 has a screw cylindrical knob 270. The knob 270 is attached to a pin that extends from the plate 266 on the opposite side of the knob 270. The lever assembly 252 is identical to the lever assembly 250 and thus has identical components including the lever plate 260, pin 268 and knob 270.

In this example, the expansion component 160 has a circuit board 280 that is mounted on a housing 282 having a front block 284 attached to a bottom plate 286. One edge of the circuit board 280 is fixed near the front block 284. The front block 284 is attached to two side plates 288 and 290. The opposite edge of the circuit board 280 includes an edge connector 292 that may be inserted the corresponding connector socket 226 extending from the closed end 222 of the bay housing 210. In this example, the edge connector 292 conforms to PCIe standards, but other types of connectors may be used.

Figure 6A:
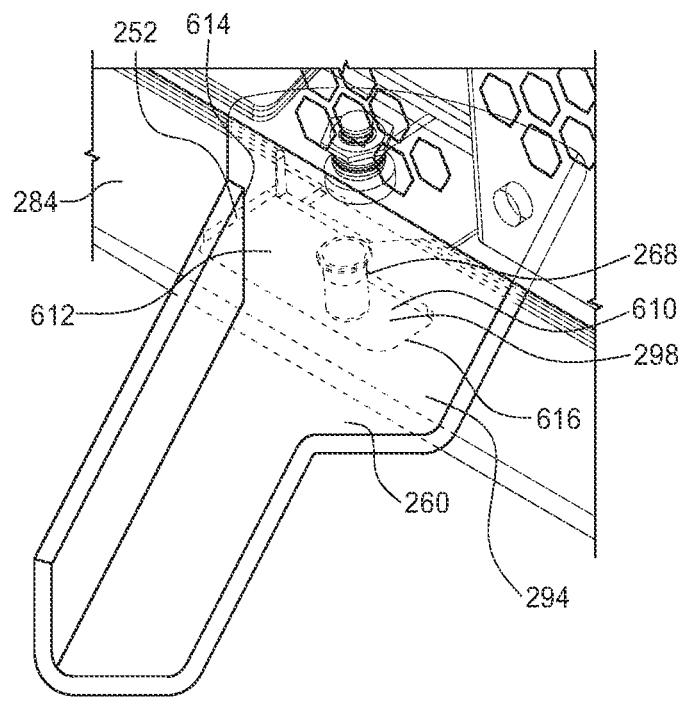
FIG. 6A is a close-up perspective view of the pin of the lever mechanism interacting with a slot of the expansion component in FIG. 2.

The front block 284 includes a top surface 294 that has two grooves 296 and 298 on opposite sides. The grooves 296 and mate with the respective pins 268 that extend from a bottom surface of the lever plates 260. FIG. 6A shows a close-up perspective cutaway view of the pin 268 on the lever assembly 252 in relation to the groove 298. As shown in FIG. 6A, the groove 298 has an "L" shape with a lateral side section 610 and a main body section 612. The main body section 612 has an open edge 614 that allows the pin 268 to enter and exit the groove 298. The side section 610 has a closed end 616.

When the expansion component 160 is initially inserted through the open end 220 of the bay housing 210, the lever assembly 252 is extended out such that the lever plate 260 is rotated away from the front cross member 224 as shown in FIGS. 4-5. When the front block 284 reaches the pins 268 of the lever assemblies 250 and 252, the pins 268 enter the grooves 298 and 296. Thus, the pin 268 in FIG. 6 will enter the main body section 612 of the groove 298 through the open edge 614. As the expansion component 160 is pushed further in, the pin 268 will be forced toward the side section 610, causing the lever plate 260 to be rotated toward the front cross member 224. Once the expansion component 160 is fully inserted into the bay housing 210, the pin 268 will be in contact with the closed end 616 of the side section 610 of the groove 298.

Figure 6B:
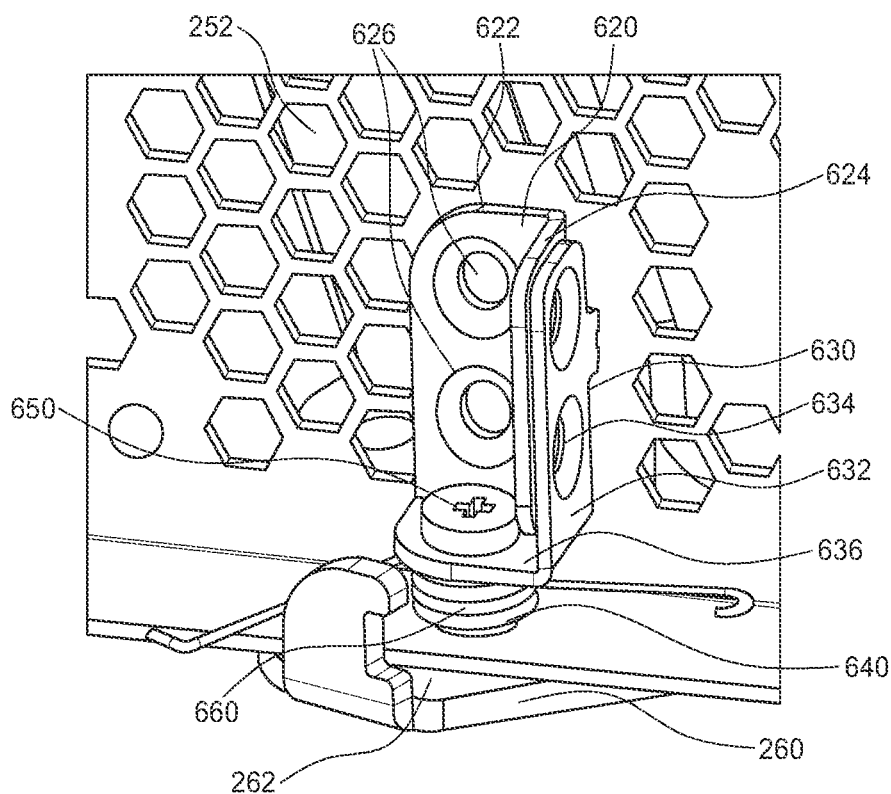
FIG. 6B is a close-up perspective view of the pivot assembly of the lever mechanism.
Figure 6C:
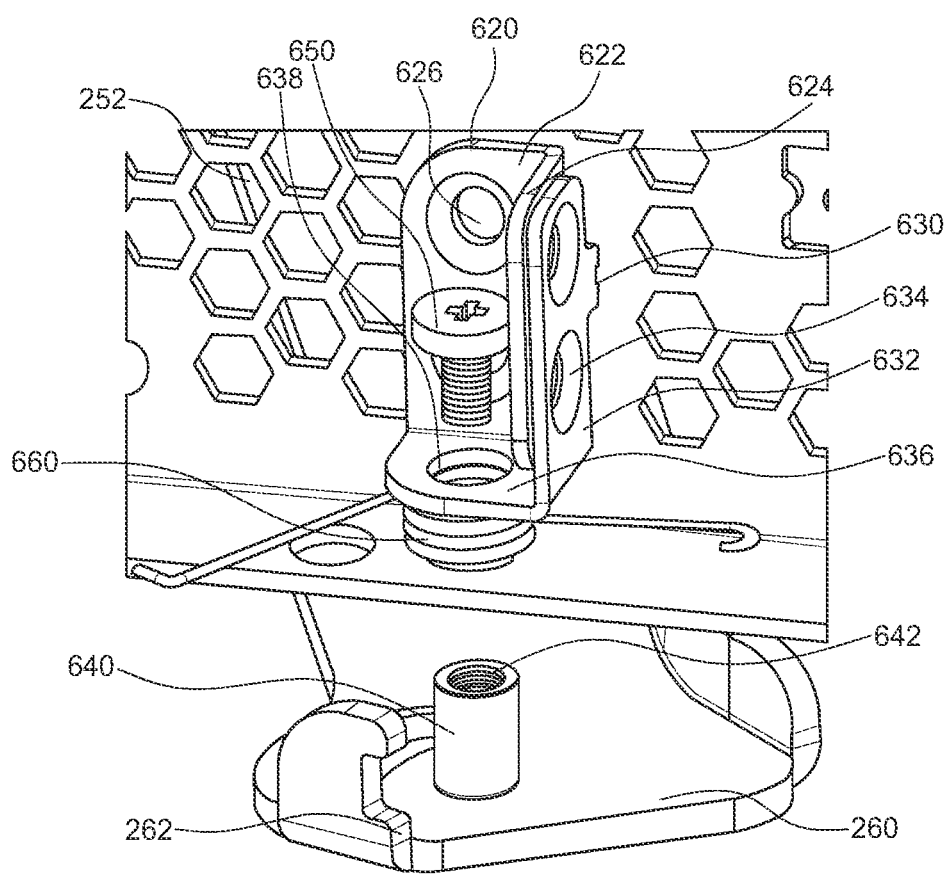
FIG. 6C is an exploded perspective of the components of the pivot assembly of the lever mechanism.

FIG. 6B shows a close-up perspective view of the pivoting mechanism that allows the lever assembly 252 to rotate relative to the front cross member 224. FIG. 6C is a close-up exploded view of the components of the pivoting mechanism. An attachment bracket 620 has a base plate 622 and a perpendicular side plate 624. The base plate 622 has two rivet holes 626 that allow the base plate 622 to be attached to the front cross member 224. The side plate 624 is attached to a pivot bracket 630. The pivot bracket 630 has a support plate 632 that is attached to the side plate 624 via rivets inserted through rivet holes 634. A pivot plate 636 is attached perpendicularly to the support plate 632 in parallel orientation with the lever plate 260 of the lever assembly 252. The pivot plate 636 has a hole 638 formed therethrough.

The larger end 262 of the lever plate 260 has a pivot cylinder 640 that is inserted through the hole 638 of the pivot plate 636. The pivot cylinder 640 may be freely rotated in the hole 638. The lever plate 260 thus rotates relative to the pivot plate 636 on the axis of the pivot cylinder 640. The pivot cylinder 640 has an open hole 642 that engages a locking screw 650 to secure the pivot cylinder 640 to the pivot plate 636. A spring 660 is inserted on the exterior of the pivot cylinder 640 to bias the lever assembly 252 away from the front cross member 224.

Figure 7:
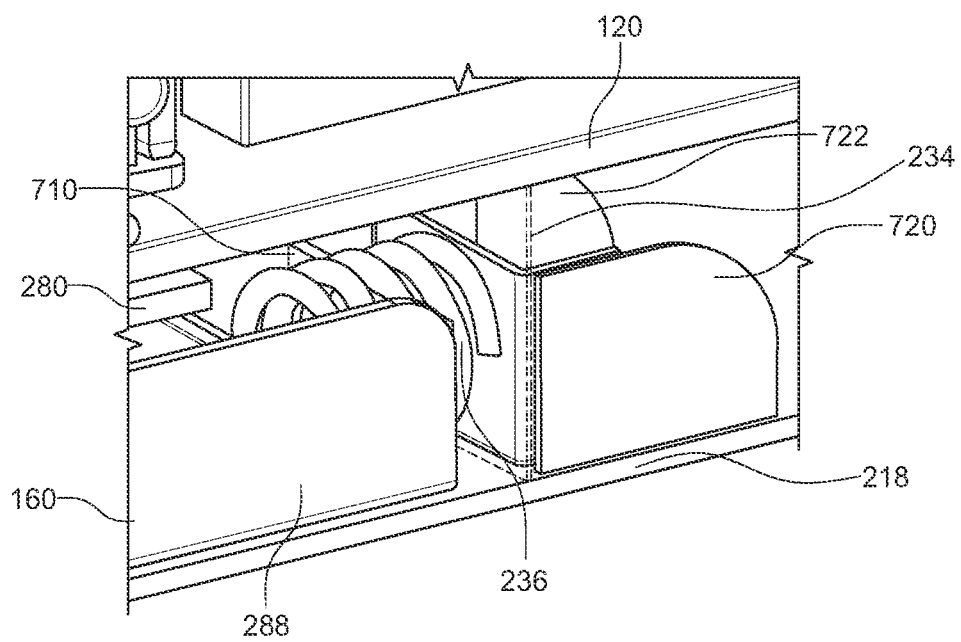
FIG. 7 is a close-up perspective view of the springs of the lever mechanism in relation to the expansion component in FIG. 2.

When the expansion component 160 is pushed through the open end 220 of the bay housing 210, the rollers 230 of the side wall 212 guide the side plate 288 of the expansion component 160. Similarly, the rollers 232 of the side wall 214 guide the side plate 290 of the expansion component 160. FIG. 7 shows a perspective cutaway view of one of the springs on closed end 222 of the bay housing 210. As explained above, the expansion component 160 is pushed toward the closed end 222 of the bay housing 210 to the fully inserted position. The expansion component 160 is guided by the pins 268 in the lever assemblies 250 and 252 interacting with the grooves 296 and 298 as well as the rollers 230 and 232. While the expansion component 160 is being pushed into the bay housing 210, the pins 240 and 242 on the bottom panel 218 shown in FIG. 5 also engage corresponding slots on the bottom plate 286 of the expansion component 160 to align the expansion component 160 in relation to the bay housing 210.

The expansion component has a tab 710 extending from the side plate 288 and the end of the bottom plate 286. The tab 710 contacts the spring 236 and a similar tab extending from the side plate 290 contacts the spring 238. The force of pushing the expansion component 160 until the edge connector 292 engages the connector socket 226 in FIG. 2 compresses the springs 236 and 238 via the tabs such as the tab 710 on the side plate 290. As shown in FIG. 7, the spring support bar 234 is reinforced and may further be attached to back supports 720 and 722 (not shown in FIGS. 3, 5 and 11 for clarity) behind the springs such as the spring 236 to reinforce the bay housing 210 against the spring force from the springs 236 and 238.

Figure 8:
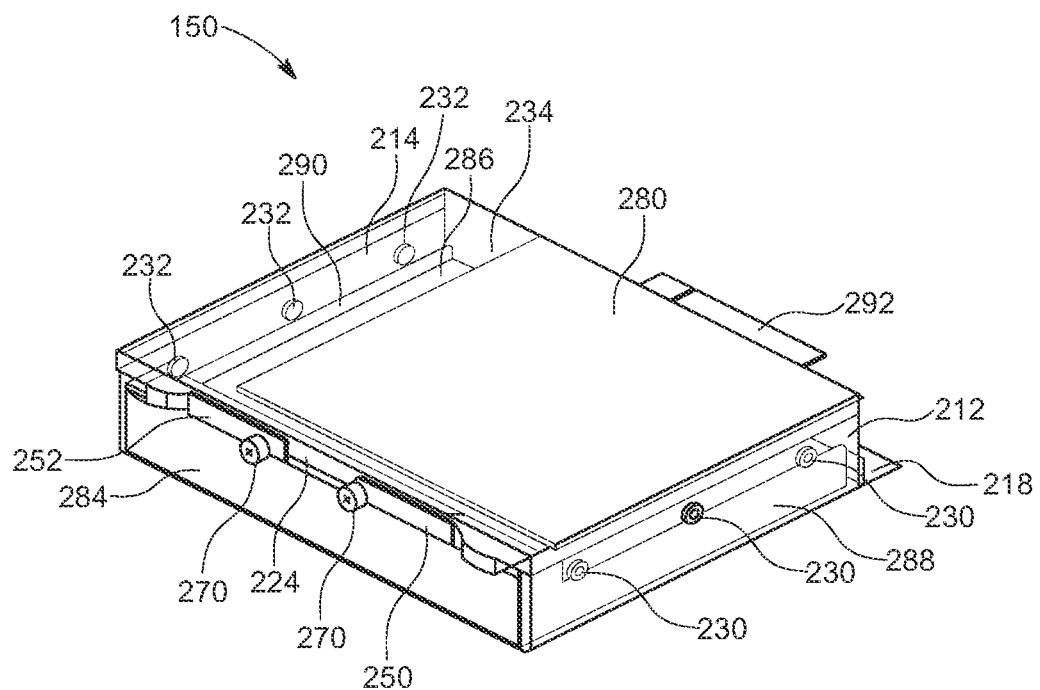
FIG. 8 is a perspective view of the example expansion component in a fully inserted position.

FIG. 8 shows a perspective view of the expansion component 160 fully inserted into the bay housing 210. The expansion component 160 is held in place in the bay housing 210 via the lever plates 260 of the lever assemblies 250 and 252 being locked into the front cross member 224 by the knobs 270. Once the expansion component 160 is fully inserted into the bay housing 210, the expansion component 160 is locked into the bay housing 210 by pushing on the knobs 270 of the lever assemblies 250 and 252. When the lever assemblies 250 and 252 are rotated fully toward the front cross member 224, the pins attached to the knobs 270 may be inserted into corresponding holes in the front cross member 224. Pushing the knobs 270 engages the pins into the holes in the front cross member 224 via friction fit and locks the lever assemblies 250 and 252 to the front cross member 224.

Figure 9:
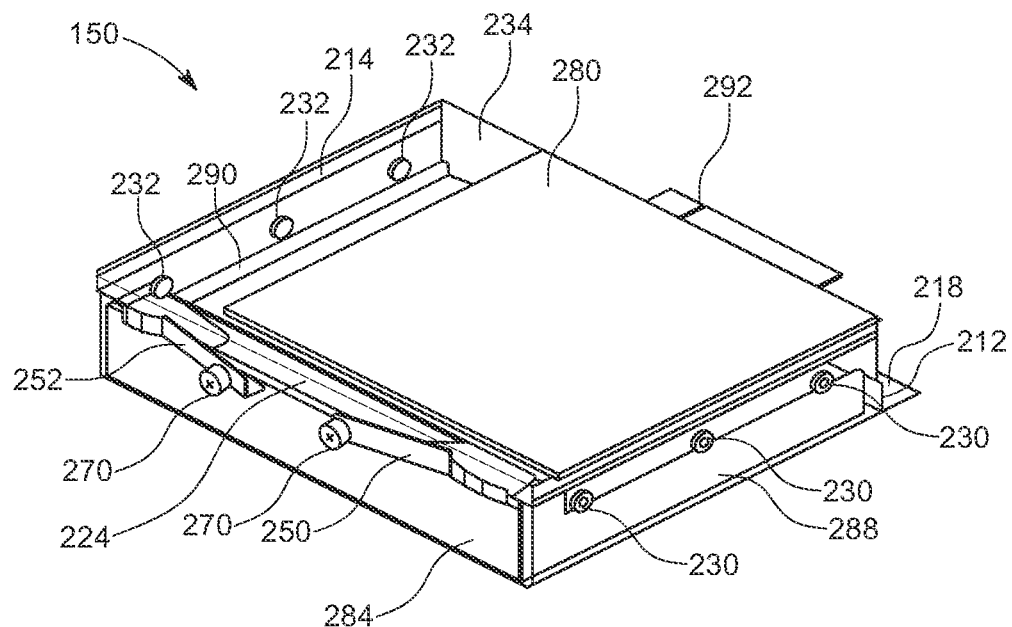
FIG. 9 is an isolated perspective view of the example lever mechanism where the levers are unlocked to allow the expansion component to be pushed to an extended position.
Figure 10:
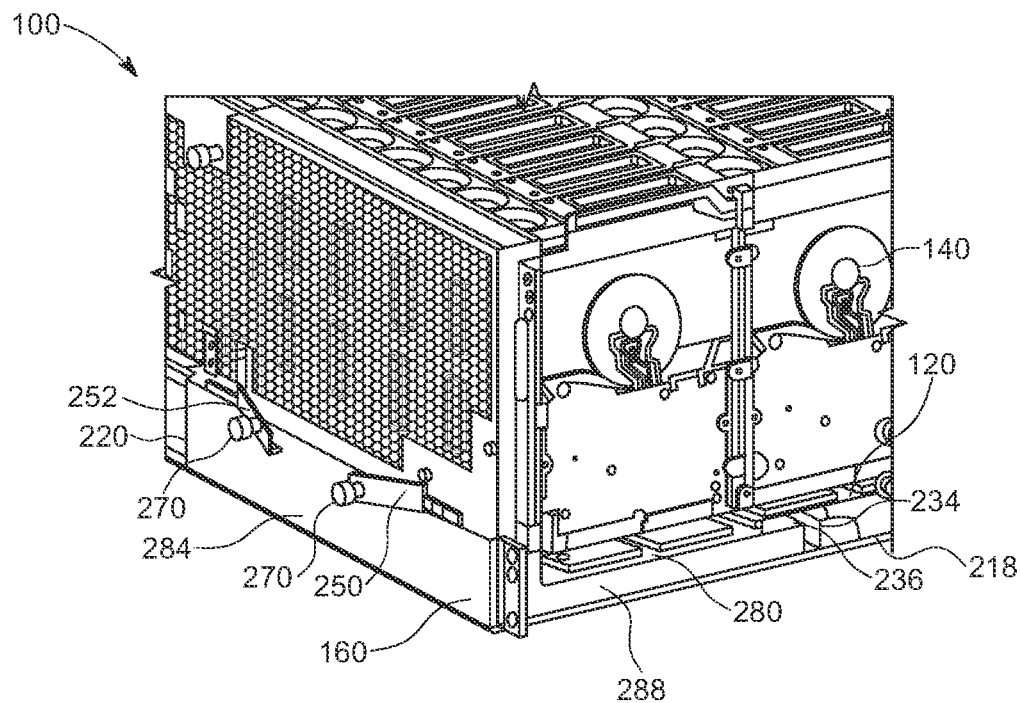
FIG. 10 is an isolated perspective view of the example tray where the levers are unlocked to allow the expansion component to be pushed to an extended position.

When the knobs 270 are turned in the opposite direction, the pins are released from the holes in the front cross member support 224. The lever assemblies 250 and 252 are thus released from the front cross member 224 as shown in FIGS. 9 and 10. When the lever assemblies 250 and 252 are released, the spring force from the springs 236 and 238 force the expansion component 160 out of the bay housing 210. The side plates 288 and 290 are guided by respective rollers 230 and 232 when the expansion component 160 is released. When the expansion component 160 is released, the spring force from the springs 236 and 238, moves the grooves 296 and 298 relative to the pins 268 in FIG. 6. The pins such as the pin 268 are forced away from the closed end 616 and to the main body section 612 of the groove 298. As the expansion component 160 is forced out of the bay housing 210, the motion of the pin 268 away from the closed end 616 rotates the lever assembly 252 away from the front cross member 224. Eventually, the pin 268 of the lever assembly 252 moves out of the groove 298 through the open edge 614. Similarly, the pin 268 of the lever assembly 250 is moved out of the groove 296 and rotates the lever assembly 250 away from the front cross member 224.

Figure 11:
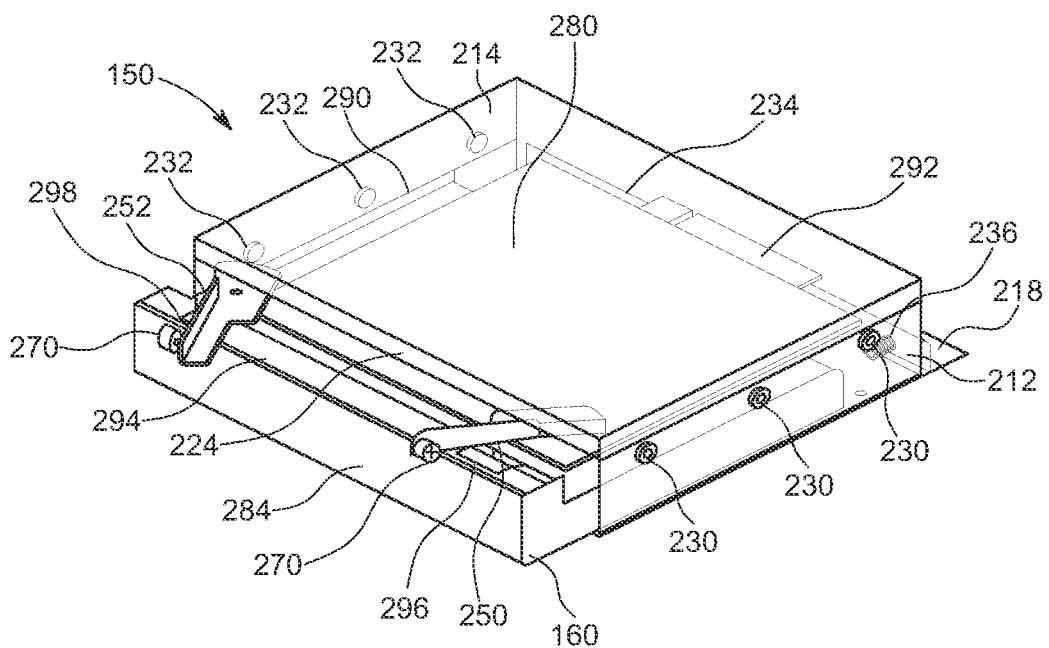
FIG. 11 is an isolated perspective view of the example tray where the levers are unlocked to allow the expansion component to be pushed to an extended position.
Figure 12:
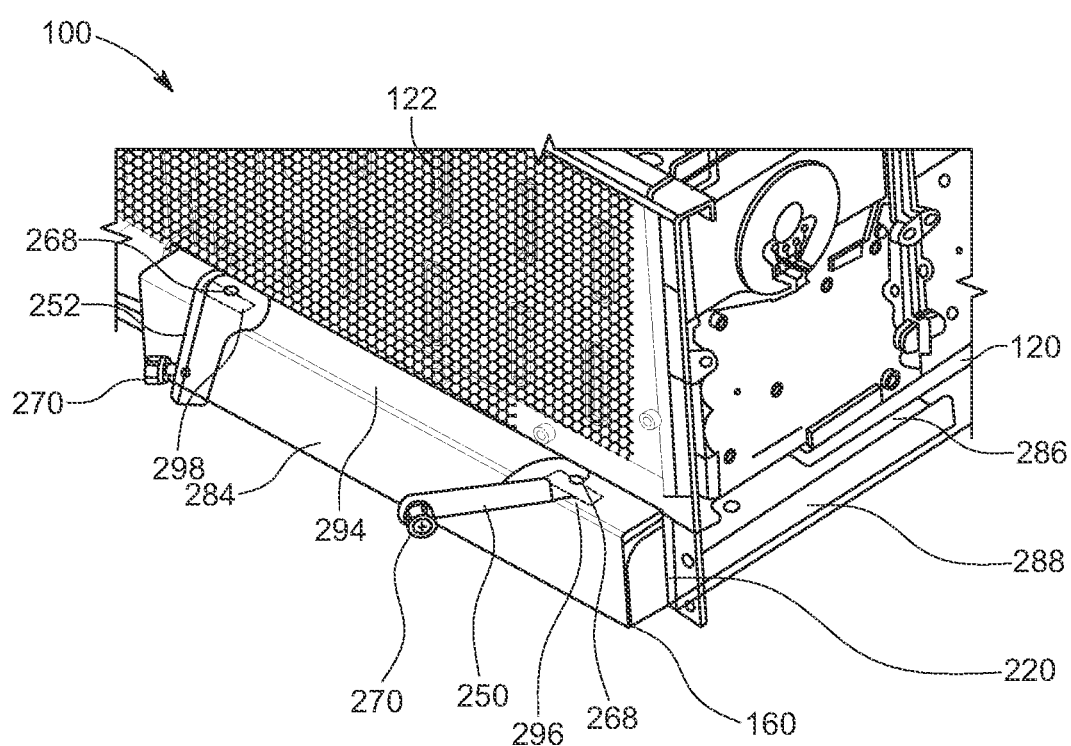
FIG. 12 is an isolated perspective view of the example tray where the levers are unlocked to allow the expansion component to be pushed to an extended position.

FIG. 11 is an isolated perspective view of the bay housing 210 showing the released lever assemblies 250 and 252. FIG. 12 is a perspective view of the bay housing 210 showing the released lever assemblies 250 and 252. The lever assemblies 250 and 252 have been rotated away from the front cross member 224 by springs 236 and 238 pushing the expansion component 160 out of the bay housing 210. At this point, the pins 268 have been moved out of the respective grooves 296 and 298. The expansion component 160 is thus partially extended away from the bay housing 210. A user may thus grip the front block 284 of the expansion component 160 and pull the expansion component 160 away from the bay housing 210 for either replacement or repair. Another expansion component identical to the expansion component 160 may then be inserted in the now empty bay housing 210.

The example spring and rotating lever assembly allows for easy insertion and release of an expansion component in the bay housing. The example assembly allows for a simple mechanism that does not require a tray for supporting the expansion component.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. An expansion bay for a computer device, the expansion bay comprising:
   two facing side walls;
   a bottom panel joining the facing side walls;
   a closed end joining the side walls and the bottom panel, and a front open end defined by the side walls and the bottom panel;
   a first rotating lever having a first registration feature for engaging an expansion component insertable through the front open end, wherein the expansion component includes a circuit board having an edge connector mateable with a socket extending from the closed end; and
   a first spring on the closed end that forces the expansion component away from the closed end.

2. The expansion bay of claim 1, further comprising rollers on an interior of one of the side walls for guiding the expansion component in and out of the expansion bay.

3. The expansion bay of claim 1, wherein the first registration feature is a pin that fits within a groove of the expansion component, wherein movement of the expansion component rotates the first rotating lever via movement of the pin in the groove.

4. The expansion bay of claim 1, wherein the first rotating lever includes a knob attached to a pin that engages a cross member in proximity to the front open end.

5. The expansion bay of claim 1, wherein the bottom panel includes a second registration feature engaging with the expansion component.

6. The expansion bay of claim 1, wherein the expansion component is a peripheral component interconnect express (PCIe) compliant device.

7. The expansion bay of claim 1, further comprising:
   a second rotating lever having a second registration feature for engaging the expansion component; and
   a second spring on the closed end that forces the expansion component away from the closed end, wherein the first rotating lever and the first spring are positioned proximate one of the side walls, and the second rotating lever and the second spring are positioned proximate the other side wall.

8. A computer device comprising:
   a chassis having two side walls, and a front end;
   a motherboard positioned in the chassis between the two side walls; and
   a bay housing for holding an expansion component mounted on the front end of the chassis, the bay housing including:
   two facing side walls;
   a bottom panel joining the facing side walls;
   a closed end joining the side walls and the bottom panel, and a front open end defined by the side walls and the bottom panel;
   a first rotating lever having a first registration feature for engaging an expansion component insertable through the front open end; and
   a first spring on the closed end that forces the expansion component away from the closed end.

9. The computer device of claim 8, wherein the computer device is one of a storage server or an application server.

10. The computer device of claim 8, wherein the bay housing further includes rollers on an interior of one of the side walls for guiding the expansion component in and out of the bay housing.

11. The computer device of claim 8, wherein the first registration feature is a pin that fits within a groove of the expansion component, wherein movement of the expansion component rotates the first rotating lever via movement of the pin in the groove.

12. The computer device of claim 8, wherein the first rotating lever includes a knob attached to a pin that engages a cross member in proximity to the open front end.

13. The computer device of claim 8, wherein the bottom panel includes a second registration feature engaging with the expansion component.

14. The computer device of claim 8, wherein the expansion component is a peripheral component interconnect express (PCIe) compliant device.

15. The computer device of claim 8, wherein the expansion component includes a circuit board having an edge connector mateable with a socket extending from the closed end of the bay housing, the socket attached to the motherboard.

16. The computer device of claim 8, wherein the bay housing further includes:
a second rotating lever having a second registration feature for engaging the expansion component; and
a second spring on the closed end that forces the expansion component away from the closed end, wherein the first rotating lever and the first spring are positioned proximate one of the side walls, and the second rotating lever and the second spring are positioned proximate the other side wall.

17. An expansion bay for a computer device, the expansion bay comprising:
two facing side walls;
a bottom panel joining the facing side walls;
a closed end joining the side walls and the bottom panel, and a front cross member joining the side walls to define a front open end;
a pair of springs on the closed end, each spring located near one of the side walls, each spring forcing the expansion component away from the closed end; and
a pair of rotating levers mounted on the front cross member near each of the side walls, each of the rotating levers having a pin that engages a groove on an expansion component insertable through the front open end, wherein the levers are rotated via the pins engaging the grooves when the expansion component is moved into and out of front open end.

* * * * *